(12) United States Patent
Suzumura

(10) Patent No.: US 11,781,053 B2
(45) Date of Patent: Oct. 10, 2023

(54) THERMALLY CONDUCTIVE COMPOSITION AND THERMALLY CONDUCTIVE SHEET USING THE SAME

(71) Applicant: Fuji Polymer Industries Co., Ltd., Nagoya (JP)

(72) Inventor: Katsuyuki Suzumura, Aichi (JP)

(73) Assignee: Fuji Polymer Industries Co., Ltd., Aichi (JP)

(*) Notice: Subject to any disclaimer, the term of this patent is extended or adjusted under 35 U.S.C. 154(b) by 561 days.

(21) Appl. No.: 16/980,208

(22) PCT Filed: Oct. 10, 2019

(86) PCT No.: PCT/JP2019/040034
§ 371 (c)(1),
(2) Date: Sep. 11, 2020

(87) PCT Pub. No.: WO2020/137086
PCT Pub. Date: Jul. 2, 2020

(65) Prior Publication Data
US 2021/0017437 A1 Jan. 21, 2021

(30) Foreign Application Priority Data

Dec. 25, 2018 (JP) ................. 2018-240911

(51) Int. Cl.
| C09K 5/14 | (2006.01) |
| C08G 77/04 | (2006.01) |
| C08K 3/22 | (2006.01) |
| C08K 3/28 | (2006.01) |
| H05K 7/20 | (2006.01) |

(52) U.S. Cl.
CPC ............... *C09K 5/14* (2013.01); *C08G 77/04* (2013.01); *C08K 3/22* (2013.01); *C08K 3/28* (2013.01); *H05K 7/2039* (2013.01); *C08K 2003/2227* (2013.01); *C08K 2003/282* (2013.01); *C08K 2201/001* (2013.01); *C08K 2201/005* (2013.01); *C08K 2201/014* (2013.01)

(58) Field of Classification Search
None
See application file for complete search history.

(56) References Cited

U.S. PATENT DOCUMENTS

| 2009/0068441 A1 | 3/2009 | Swaroop et al. |
| 2014/0190672 A1 | 7/2014 | Swaroop et al. |
| 2017/0022407 A1 | 1/2017 | Hatakeyama et al. |
| 2018/0354793 A1* | 12/2018 | Ikemiya .............. C01B 21/0648 |
| 2019/0256756 A1 | 8/2019 | Ishihara et al. |
| 2019/0292349 A1 | 9/2019 | Ito |
| 2021/0147681 A1* | 5/2021 | Hirakawa .............. C08G 77/18 |

FOREIGN PATENT DOCUMENTS

| EP | 3 489 305 | 5/2019 |
| JP | 2002-322372 | 11/2002 |
| JP | 2010-168558 | 8/2010 |
| JP | 2015-168791 | 9/2015 |
| JP | 5931129 B | 6/2016 |
| JP | 2016-172824 | 9/2016 |
| JP | 2017-210518 | 11/2017 |
| WO | 2013/094613 | 6/2013 |
| WO | 2016/125664 | 8/2016 |
| WO | 2017/203924 | 11/2017 |
| WO | 2018/016566 | 1/2018 |
| WO | 2018/074247 | 4/2018 |

OTHER PUBLICATIONS

Extended European Search Report issued in corresponding European Application No. 19906234.0, dated Feb. 25, 2021, 8 pages.
Office Action issued in corresponding Japanese Patent Application No. 2020-500922, dated Mar. 3, 2020, 4 pages with translation.
International Search Report issued in International Patent Application No. PCT/JP2019/040034, dated Dec. 24, 2019, 4 pages with translation.
Office Action issued in corresponding Chinese Patent Application No. 201980028525.7, dated Apr. 2, 2021, 12 pages w/ translation.

* cited by examiner

*Primary Examiner* — Robert T Butcher
(74) *Attorney, Agent, or Firm* — Hamre, Schumann, Mueller & Larson, P.C.

(57) ABSTRACT

A thermally conductive composition includes a matrix resin, a curing catalyst, and thermally conductive particles. The thermally conductive particles include, with respect to 100 parts by mass of the matrix resin component, (a) 900 parts by mass or more of aluminum nitride with an average particle size of 50 μm or more, (b) 400 parts by mass or more of aluminum nitride with an average particle size of 5 μm or less, and (c) more than 0 parts by mass and 400 parts by mass or less of alumina with an average particle size of 6 μm or less. A cured product of the thermally conductive composition has a thermal conductivity of 12 W/m·K or more and an Asker C hardness of 20 to 75. Thus, a thermally conductive composition having a hardness suitable for mounting to an electrical or electronic component and high thermal conductive properties, and a thermally conductive sheet using the thermally conductive composition are provided.

16 Claims, 1 Drawing Sheet

THERMALLY CONDUCTIVE COMPOSITION AND THERMALLY CONDUCTIVE SHEET USING THE SAME

TECHNICAL FIELD

The present invention relates to a thermally conductive composition suitable for being interposed between a heat generating part and a heat dissipater of an electrical component, an electronic component or the like, and a thermally conductive sheet using the thermally conductive composition.

BACKGROUND ART

Recently, the performance of semiconductors such as CPUs has improved appreciably, and the amounts of heat generated by the semiconductors have increased enormously. To cope with this, heat dissipaters are attached to electronic components that generate heat, and thermally conductive silicone sheets are adopted to improve the contact between the semiconductors and the heat dissipaters. Further, along with the size reduction, high performance, and high integration of devices, the thermally conductive silicone sheets are required to have softness and high thermal conductive properties. Conventionally, Patent Documents 1 to 4 propose thermally conductive silicone gel sheets.

PRIOR ART DOCUMENTS

Patent Documents

Patent Document 1: JPWO 2018/016566 A1
Patent Document 2: JP 5931129 B2
Patent Document 3: WO 2018/074247 A1
Patent Document 4: JP 2017-210518 A

DISCLOSURE OF INVENTION

Problem to be Solved by the Invention

However, conventional thermally conductive silicone sheets have difficulty following the unevenness of a heat generating part and/or a heat dissipating part, and low thermal conductivities, and thus need to be improved.

To solve the above conventional problems, the present invention provides a thermally conductive composition having a hardness suitable for mounting to an electronic component or the like and high thermal conductive properties, and a thermally conductive sheet using the thermally conductive composition.

Means for Solving Problem

A thermally conductive composition of the present invention includes a matrix resin, a curing catalyst, and thermally conductive particles. The thermally conductive particles include, with respect to 100 parts by mass of the matrix resin component,
  (a) 900 parts by mass or more of aluminum nitride with an average particle size of 50 μm or more,
  (b) 400 parts by mass or more of aluminum nitride with an average particle size of 5 μm or less, and
  (c) more than 0 parts by mass and 400 parts by mass or less of alumina with an average particle size of 6 μm or less.

A cured product of the thermally conductive composition has a thermal conductivity of 12 W/m·K or more and an Asker C hardness of 20 to 75.

A thermally conductive sheet of the present invention includes the thermally conductive composition that is formed into a sheet.

Effects of the Invention

With the above composition, the present invention can provide a thermally conductive composition having a thermal conductivity of 12 W/m·K or more and an Asker C hardness of 20 to 75, i.e., high thermal conductive properties and a hardness suitable for mounting to an electronic component or the like, and a thermally conductive sheet using the thermally conductive composition. In particular, by adding a small amount of microparticle size alumina, it is possible to highly pack the aluminum nitride and allow continuous forming.

DESCRIPTION OF THE INVENTION

Figure 1A:
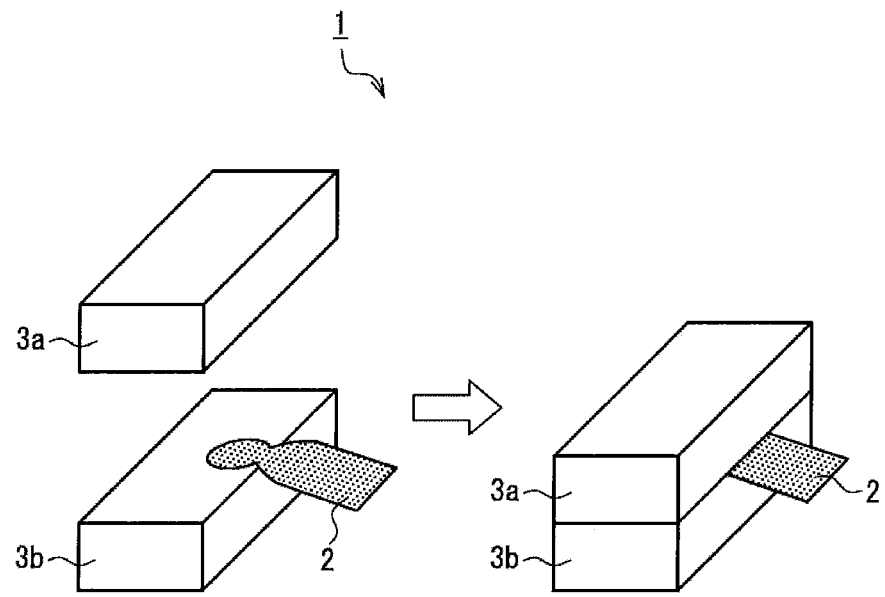
FIGS. 1A to 1B are diagrams illustrating a method of measuring a thermal conductivity of a sample in an example of the present invention.

The present invention relates to a thermally conductive composition that includes a matrix resin, a curing catalyst, and thermally conductive particles. It is preferable that the matrix resin includes thermosetting resins such as silicone rubber, silicone gel, acrylic rubber, fluorocarbon rubber, epoxy resin, phenol resin, unsaturated polyester resin, melamine resin, acrylic resin, silicone resin, and fluorocarbon resin. Among these, silicone is preferred and may be selected from elastomer, gel, putty, grease, and oil. Any curing system such as a peroxide system, an addition system, or a condensation system may be used. Silicone is preferred because of its high thermal resistance. Moreover, addition reaction silicone is preferred because the silicone is not corrosive to the surroundings, releases less by-products outside the system, and is cured to its core reliably.

The thermally conductive particles include, with respect to 100 parts by mass of the matrix resin component,
  (a) 900 parts by mass or more of aluminum nitride with an average particle size of 50 μm or more,
  (b) 400 parts by mass or more of aluminum nitride with an average particle size of 5 μm or less, and
  (c) more than 0 parts by mass and 400 parts by mass or less of alumina with an average particle size of 6 μm or less.

A cured product of the thermally conductive composition has a thermal conductivity of 12 W/m·K or more and an Asker C hardness of 20 to 75. Thus, it is possible to obtain a hardness suitable for mounting to an electronic component or the like and high thermal conductive properties.

It is preferable that 0.1 to 10 parts by mass of a silane coupling agent is further added with respect to 100 parts by mass of the matrix resin component. The silane coupling agent covers the surfaces of the thermally conductive particles (surface treatment), allows the thermally conductive particles to be easily incorporated into the matrix resin, prevents the curing catalyst from being adsorbed on the thermally conductive particles, and thus has the effect of preventing cure inhibition. This is useful for storage stability.

It is preferable that the aluminum nitride (a) with the average particle size of 50 μm or more is spherically agglomerated. As the aluminum nitride becomes more spherical in shape, it flows more easily in a compound, which improves packing properties.

The addition ratio of the alumina (c) to the total amount of the thermally conductive particles is preferably more than 0 and 19% by mass or less, and more preferably 5 to 19% by mass. By adding a small amount of microparticle size alumina, it is possible to highly pack the aluminum nitride and allow continuous forming.

The addition ratio of the aluminum nitride (a) with the average particle size of 50 μm or more to the aluminum nitride (b) with the average particle size of 5 μm or less is preferably (a)/(b)=1.65 to 2.60. With the above ratio, it is possible to highly pack the aluminum nitride and provide a thermally conductive composition having a hardness suitable for mounting to an electronic component or the like and high thermal conductive properties, and a thermally conductive sheet using the thermally conductive composition.

The thermally conductive particles may further include 350 to 500 parts by mass of aluminum nitride (d) with an average particle size of more than 5 μm and less than 50 μm with respect to 100 parts by mass of the matrix resin component. Thus, it is possible to provide a thermally conductive composition having a hardness suitable for mounting to an electronic component or the like and high thermal conductive properties, and a thermally conductive sheet using the thermally conductive composition.

It is preferable that the dielectric breakdown voltage (JIS K6249) of the thermally conductive composition is 11 to 16 kV/mm. Thus, it is possible to obtain a thermally conductive sheet having high electrical insulation properties.

It is preferable that the volume resistivity (JIS K6249) of the thermally conductive composition is $10^{10}$ to $10^{14}$Ω·cm. Thus, it is possible to obtain a thermally conductive sheet having high electrical insulation properties.

It is preferable that the thermally conductive composition is formed into a sheet. The thermally conductive composition in the form of a sheet is suitable for mounting to an electronic component or the like. It is preferable that the thickness of the thermally conductive sheet is 0.2 to 10 mm.

Preferably, the uncured composition is a compound with the following constitution:

A Matrix Resin Component

The matrix resin component includes the following (A1) and (A2). The components (A1) and (A2) will add up to 100% by mass.
  (A1) Linear organopolysiloxane having at least two alkenyl groups per molecule, in which the alkenyl groups are bonded to silicon atoms.
  (A2) Crosslinking component: an organohydrogenpolysiloxane having at least two hydrogen atoms bonded to silicon atoms per molecule, in which the amount of the organohydrogenpolysiloxane is less than 1 mol with respect to 1 mol of the alkenyl groups bonded to the silicon atoms in the above component A.

Other than the above components (A1) and (A2), an organopolysiloxane that does not have any reactive group may be included.

B Thermally Conductive Particles

The thermally conductive particles include the following:
  (a) 900 parts by mass or more, preferably 900 to 1300 parts by mass, and more preferably 900 to 1100 parts by mass of the aluminum nitride with the average particle size of 50 μm or more with respect to 100 parts by mass of the matrix resin;
  (b) 400 parts by mass or more, preferably 400 to 800 parts by mass, and more preferably 400 to 600 parts by mass of the aluminum nitride with the average particle size of 5 μm or less with respect to 100 parts by mass of the matrix resin; and
  (c) more than 0 parts by mass and 400 parts by mass or less, preferably more than 50 parts by mass and 400 parts by mass or less, and more preferably 100 to 300 parts by mass of the alumina with the average particle size of 6 μm or less with respect to 100 parts by mass of the matrix resin.

C Platinum group metal catalyst: the amount of the catalyst is 0.01 to 1000 ppm in mass with respect to the matrix resin component D Other additive agents: any amount of curing retarder, coloring agent, or the like; silane coupling agent Hereinafter, each component will be described.

(1) Base Polymer Component (Component A1)

The base polymer component is an organopolysiloxane having two or more alkenyl groups bonded to silicon atoms per molecule. The organopolysiloxane containing two or more alkenyl groups is the base resin (base polymer component) of the silicone rubber composition of the present invention. In the organopolysiloxane, two alkenyl groups having 2 to 8 carbon atoms, and preferably 2 to 6 carbon atoms such as vinyl groups or allyl groups are bonded to the silicon atoms per molecule. The viscosity of the organopolysiloxane is preferably 10 to 1000000 mPa·s, and more preferably 100 to 100000 mPa·s at 25° C. in terms of workability and curability.

Specifically, an organopolysiloxane expressed by the following general formula (Chemical Formula 1) is used. The organopolysiloxane has two or more alkenyl groups per molecule, in which the alkenyl groups are bonded to silicon atoms at ends of the molecular chain. The organopolysiloxane is a linear organopolysiloxane whose side chains are blocked with alkyl groups. The viscosity of the linear organopolysiloxane is preferably 10 to 1000000 mPa·s at 25° C. in terms of workability and curability. Moreover, the linear organopolysiloxane may include a small amount of branched structure (trifunctional siloxane units) in the molecular chain.

[Chemical Formula 1]

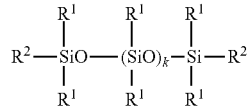

In the general formula, $R^1$ represents substituted or unsubstituted monovalent hydrocarbon groups that are the same as or different from each other and have no aliphatic unsaturated bond, $R^2$ represents alkenyl groups, and k represents 0 or a positive integer. The monovalent hydrocarbon groups represented by $R^1$ preferably have 1 to 10 carbon atoms, and more preferably 1 to 6 carbon atoms. Specific examples of the monovalent hydrocarbon groups include the following: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups. The alkenyl groups represented by $R^2$ preferably have 2 to 6 carbon atoms, and more preferably 2 to 3 carbon atoms. Specific examples of the alkenyl groups include vinyl, allyl, propenyl, isopropenyl, butenyl, isobutenyl, hexenyl, and cyclohexenyl groups. In particular, the vinyl group is preferred. In the general formula (1), k is typically 0 or a positive integer satisfying $0 \leq k \leq 10000$, preferably $5 \leq k \leq 2000$, and more preferably $10 \leq k \leq 1200$.

The component A1 may also include an organopolysiloxane having three or more, typically 3 to 30, and preferably about 3 to 20, alkenyl groups bonded to silicon atoms per molecule. The alkenyl groups have 2 to 8 carbon atoms, and preferably 2 to 6 carbon atoms and can be, e.g., vinyl groups or allyl groups. The molecular structure may be a linear, ring, branched, or three-dimensional network structure. The organopolysiloxane is preferably a linear organopolysiloxane in which the main chain is composed of repeating diorganosiloxane units, and both ends of the molecular chain are blocked with triorganosiloxy groups. The viscosity of the linear organopolysiloxane is preferably 10 to 1000000 mPa·s, and more preferably 100 to 100000 mPa·s at 25° C.

Each of the alkenyl groups may be bonded to any part of the molecule. For example, the alkenyl group may be bonded to either a silicon atom that is at the end of the molecular chain or a silicon atom that is not at the end (but in the middle) of the molecular chain. In particular, a linear organopolysiloxane expressed by the following general formula (Chemical Formula 2) is preferred. The linear organopolysiloxane has 1 to 3 alkenyl groups on each of the silicon atoms at both ends of the molecular chain. In this case, however, if the total number of the alkenyl groups bonded to the silicon atoms at both ends of the molecular chain is less than 3, at least one alkenyl group is bonded to the silicon atom that is not at the end (but in the middle) of the molecular chain (e.g., as a substituent in the diorganosiloxane unit). As described above, the viscosity of the linear organopolysiloxane is preferably 10 to 1000000 mPa·s at 25° C. in terms of workability and curability. Moreover, the linear organopolysiloxane may include a small amount of branched structure (trifunctional siloxane units) in the molecular chain.

[Chemical Formula 2]

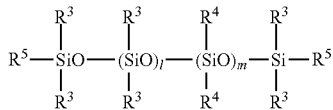

In the general formula, $R^3$ represents substituted or unsubstituted monovalent hydrocarbon groups that are the same as or different from each other, and at least one of them is an alkenyl group, $R^4$ represents substituted or unsubstituted monovalent hydrocarbon groups that are the same as or different from each other and have no aliphatic unsaturated bond, $R^5$ represents alkenyl groups, and l and m represent 0 or a positive integer. The monovalent hydrocarbon groups represented by $R^3$ preferably have 1 to 10 carbon atoms, and more preferably 1 to 6 carbon atoms. Specific examples of the monovalent hydrocarbon groups include the following: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; alkenyl groups such as vinyl, allyl, propenyl, isopropenyl, butenyl, hexenyl, cyclohexenyl, and octenyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups.

The monovalent hydrocarbon groups represented by $R^4$ also preferably have 1 to 10 carbon atoms, and more preferably 1 to 6 carbon atoms. The monovalent hydrocarbon groups may be the same as the specific examples of $R^1$, but do not include an alkenyl group. The alkenyl groups represented by $R^5$ preferably have 2 to 6 carbon atoms, and more preferably 2 to 3 carbon atoms. Specific examples of the alkenyl groups are the same as those of $R^2$ in the general formula (Chemical Formula 1), and the vinyl group is preferred. In the general formula, l and m are typically 0 or positive integers satisfying $0 < l+m \leq 10000$, preferably $5 \leq l+m \leq 2000$, and more preferably $10 \leq l+m \leq 1200$. Moreover, l and m are integers satisfying $0 < l/(l+m) \leq 0.2$, and preferably $0.001 \leq l/(l+m) \leq 0.1$.

(2) Crosslinking Component (Component A2)

The component A2 is an organohydrogenpolysiloxane that acts as a crosslinking agent. The addition reaction (hydrosilylation) between SiH groups in this component and alkenyl groups in the component A produces a cured product. Any organohydrogenpolysiloxane that has two or more hydrogen atoms (i.e., SiH groups) bonded to silicon atoms per molecule may be used. The molecular structure of the organohydrogenpolysiloxane may be a linear, ring, branched, or three-dimensional network structure. The number of silicon atoms in a molecule (i.e., the degree of polymerization) may be 2 to 1000, and preferably about 2 to 300.

The locations of the silicon atoms to which the hydrogen atoms are bonded are not particularly limited. The silicon atoms may be either at the ends or not at the ends (but in the middle) of the molecular chain. The organic groups bonded to the silicon atoms other than the hydrogen atoms may be, e.g., substituted or unsubstituted monovalent hydrocarbon groups that have no aliphatic unsaturated bond, which are the same as those of $R^1$ in the general formula (Chemical Formula 1).

The structures expressed by the following general formula can be given as examples of the organohydrogenpolysiloxane of the component A2.

[Chemical Formula 3]

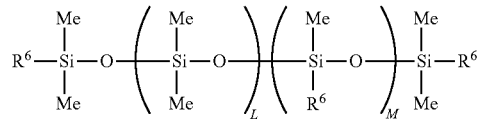

In the above general formula, $R^6$ represents an alkyl group, a phenyl group, an epoxy group, an acryloyl group, a methacryloyl group, an alkoxy group, and a hydrogen atom, which are the same as or different from each other, and at least two of them are hydrogen atoms. L is an integer of 0 to 1000, and preferably 0 to 300, and M is an integer of 1 to 200.

(3) Catalyst Component (Component C)

The catalyst component of the component C may be a catalyst used for a hydrosilylation reaction. Examples of the catalyst include platinum group metal catalysts such as platinum-based, palladium-based, and rhodium-based catalysts. The platinum-based catalysts include, e.g., platinum black, platinum chloride, chloroplatinic acid, a reaction product of chloroplatinic acid and monohydric alcohol, a complex of chloroplatinic acid and olefin or vinylsiloxane, and platinum bisacetoacetate.

(4) Thermally Conductive Particles (Component B)

It is preferable that 1900 to 2500 parts by mass of the thermally conductive particles of the component B in total is added with respect to 100 parts by mass of the component A, i.e., the matrix resin component. Thus, it is possible to maintain a high thermal conductivity. Specific examples of the thermally conductive particles are described in the following.

(a) It is preferable that the aluminum nitride with the average particle size of 50 μm or more is spherically agglomerated. Thus, it is possible to maintain a high thermal conductivity. The average particle size of the above spherically agglomerated aluminum nitride is preferably 50 to 100 μm, and more preferably 60 to 90 μm.

(b) It is preferable that the aluminum nitride with the average particle size of 5 μm or less is crushed (i.e., irregularly shaped). Thus, it is possible to maintain a high thermal conductivity. The average particle size of the above crushed (irregularly shaped) aluminum nitride is preferably 0.1 to 5 μm, and more preferably 0.5 to 3 μm.

(c) It is preferable that the alumina with the average particle size of 6 μm or less is crushed (i.e., irregularly shaped). Thus, it is possible to maintain a high thermal conductivity. The average particle size of the above crushed (irregularly shaped) alumina is preferably 0.01 to 6 μm, and more preferably 0.1 to 3 μm.

(d) It is preferable that the aluminum nitride with the average particle size of more than 5 μm and 50 μm or less is crushed (i.e., irregularly shaped). Thus, it is possible to maintain a high thermal conductivity. The average particle size of the above crushed (irregularly shaped) aluminum nitride is preferably 10 to 45 μm, and more preferably 10 to 35 μm.

In the present invention, the thermally conductive particles include three or more types of inorganic particles with different average particle sizes. Thus, small-size inorganic particles fill the spaces between large-size inorganic particles, which can provide nearly the closest packing and improve thermal conductive properties.

It is preferable that the thermally conductive particles are surface treated with the silane coupling agent. Examples of the silane coupling agent includes: a silane compound expressed by $R(CH_3)_a Si(OR')_{3-a}$, where R represents a substituted or unsubstituted organic group having 1 to 20 carbon atoms, R' represents an alkyl group having 1 to 4 carbon atoms, and a is 0 or 1; and its partial hydrolysate. Examples of an alkoxysilane compound (simply referred to as "silane" in the following) expressed by $R(CH_3)_a Si(OR')_{3-a}$, where R represents a substituted or unsubstituted organic group having 1 to 20 carbon atoms, R' represents an alkyl group having 1 to 4 carbon atoms, and a is 0 or 1, include the following: methyltrimethoxysilane; ethyltrimethoxysilane; propyltrimethoxysilane; butyltrimethoxysilane; pentyltrimethoxysilane; hexyltrimethoxysilane; hexyltriethoxysilane; octyltrimethoxysilane; octyltriethoxysilane; decyltrimethoxysilane; decyltriethoxysilane; dodecyltrimethoxysilane; dodecyltriethoxysilane; hexadecyltrimethoxysilane; hexadecyltriethoxysilane; octadecyltrimethoxysilane; and octadecyltriethoxysilane. These silane compounds may be used individually or in combinations of two or more. The alkoxysilane and one-end silanol siloxane may be used together as the surface treatment agent. In this case, the surface treatment may include adsorption in addition to a covalent bond. The silane coupling agent may be mixed with the thermally conductive particles in advance to perform a pretreatment or added when the matrix resin, the curing catalyst, and the thermally conductive particles are mixed (integral blend method).

(5) Other Additive Agents:

The composition of the present invention may include components other than the above as needed. For example, the composition may include a heat resistance improver such as colcothar, titanium oxide or cerium oxide, a flame retardant aid, and a curing retarder. An organic or inorganic pigment may be added for coloring and toning. The silane coupling agent may be added.

EXAMPLES

Hereinafter, the present invention will be described by way of examples. However, the present invention is not limited to the following examples. Various parameters were measured in the following manner.

<Thermal Conductivity>

Figure 1B:
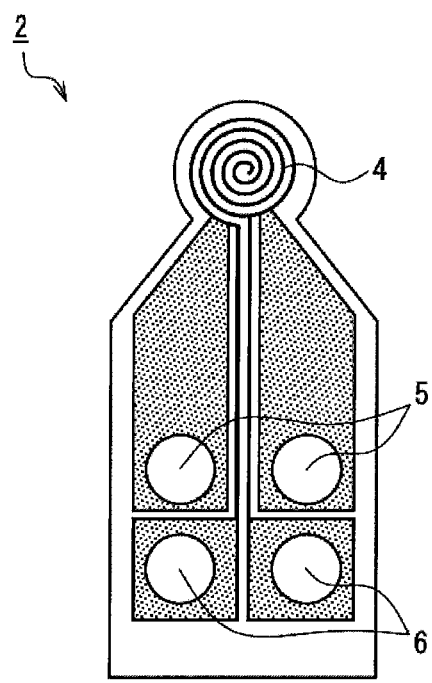

The thermal conductivity of a thermally conductive silicone rubber sheet was measured by a hot disk (in accordance with ISO/CD 22007-2). As shown in FIG. 1A, using a thermal conductivity measuring apparatus 1, a polyimide film sensor 2 was sandwiched between two samples 3a, 3b, and constant power was applied to the sensor 2 to generate a certain amount of heat. Then, the thermal characteristics were analyzed from a temperature rise value of the sensor 2. The sensor 2 has a tip 4 with a diameter of 7 mm. As shown in FIG. 1B, the tip 4 has a double spiral structure of electrodes. Moreover, an electrode 5 for an applied current and an electrode 6 for a resistance value (temperature measurement electrode) are located on the lower portion of the sensor 2. The thermal conductivity was calculated by the following formula (1).

$$\lambda = \frac{P_D \cdot D(\tau)}{\pi^{3/2} \cdot r} \cdot \frac{D(\tau)}{\Delta T(\tau)} \qquad \text{[Formula 1]}$$

λ: Thermal conductivity (W/m·K)
$P_0$: Constant power (W)
r: Radius of sensor (m)
τ: $\sqrt{\alpha \cdot t / r^2}$
α: Thermal diffusivity of sample (m²/s)
t: Measuring time (s)
D(τ): Dimensionless function of τ
ΔT(τ): Temperature rise of sensor (K)

<Hardness>

The Asker C hardness of the thermally conductive silicone rubber sheet was measured.

Examples 1-4

1. Material Components (1) Polyorganosiloxane (Component A)

A two-part room temperature curing silicone polymer (silicone component) containing polyorganosiloxane was used. One solution (solution A1) contained a base polymer component and a platinum group metal catalyst. The other solution (solution A2) contained a base polymer component and an organohydrogenpolysiloxane which is a crosslinking agent component.

(2) Thermally Conductive Particles (Component B)

Five types of thermally conductive particles shown in Table 1 were used. Then, 1% by mass of a silane coupling agent (octyltriethoxysilane) was added to alumina particles and stirred uniformly. The stirred alumina particles were spread uniformly over, e.g., a tray and dried at 100° C. for 2 hours. Thus, the alumina particles were surface treated. This surface treatment prevented a reduction in the curing reaction that is the catalytic ability of the Pt catalyst. In this case, the average particle size means D50 (median diameter) in a volume-based cumulative particle size distribution, which is determined by a particle size distribution measurement with a laser diffraction scattering method. The measuring device may be, e.g., a laser diffraction/scattering particle size distribution analyzer LA-950 S2 manufactured by HORIBA, Ltd. The values indicating lengths in the Table are average particle sizes of each particle. Moreover, "AlN" in the Table is an abbreviation for aluminum nitride.

(3) Platinum Group Metal Catalyst (Component C)

A platinum-vinyldisiloxane complex was used as an additional platinum group metal catalyst. As described above, the two-part room temperature curing silicone polymer (silicone component) contained the platinum group metal catalyst. In the preparation of the silicone compositions of the Examples, the additional platinum group metal catalyst was added in an amount of 1 part by mass (1 g) with respect to 100 parts by mass (100 g) of the silicone component so that the polyorganosiloxane was fully subjected to primary curing. In the silicone compositions of the Examples, the amount of the platinum group metal catalyst was 0.01 to 1000 ppm expressed in terms of the mass of metal atoms with respect to the total amount of the polyorganosiloxane and the platinum group metal catalyst.

2. Compound

Each of the materials was weighed in the amount as shown in Table 1. Then, the materials were placed in a kneader to form a compound.

Table 1 indicates the amount of each material (parts by mass) with respect to 100 parts by mass (100 g) of the silicone component (two-part room temperature curing silicone polymer). In all the compounds, the amounts of the thermally conductive particles and other components added to 100 parts by mass (100 g) of the polyorganosiloxane satisfy their respective preferred amounts of the present invention, as described above.

3. Sheet Forming Process

The compound was sandwiched between polyethylene terephthalate (PET) films that had been subjected to a release treatment. The layered material was formed into a sheet with a thickness of 2.0 mm by constant speed rolls. Subsequently, the sheet was heated and cured at 100° C. for 15 minutes, resulting in a thermally conductive silicone rubber sheet. Table 1 shows the conditions as described above and the results.

TABLE 1

|  |  | Ex. 1 | Ex. 2 | Ex. 3 | Ex. 4 |
|---|---|---|---|---|---|
| Matrix | Base polymer: A1 (g) | 50 | 50 | 50 | 50 |
|  | Base polymer: A2 (g) | 50 | 50 | 50 | 50 |
| Catalyst | Platinum catalyst (g) | 1 | 1 | 1 | 1 |
| Thermally conductive particles | Crushed alumina 0.3 μm (g) | 200 | 200 | 400 | 400 |
|  | Crushed AlN 1.2 μm (g) | 500 | 500 | 400 | 400 |
|  | Crushed AlN 28.8 μm (g) | 470 | 470 | 370 | 370 |
|  | Spherically agglomerated AlN 50 μm (g) |  | 400 |  | 400 |
|  | Spherically agglomerated AlN 80 μm (g) | 1000 | 600 | 1000 | 600 |
| Additive agent | Decyltrimethoxysilane (g) | 5 | 5 | 5 | 5 |
| Result | Thermal conductivity (W/mK) [Hot disk] | 14.4 | 12.9 | 13.2 | 12.4 |
|  | Hardness [ASKER C] | 57 | 50 | 57 | 52 |
| Note | Total amount of thermally conductive particles (g) | 2170 | 2170 | 2170 | 2170 |
|  | Alumina/total amount of thermally conductive particles (% by mass) | 9.2 | 9.2 | 18.4 | 18.4 |
|  | AlN 50 μm or more/AlN 5 μm or less | 2.00 | 2.00 | 2.50 | 2.50 |
|  | Total amount of thermally conductive particles/gross amount (% by mass) | 95.3 | 95.3 | 95.3 | 95.3 |

*Ex.: Example

Comparative Examples 1-5

Comparative Examples were performed in the same manner as Example 1 except that the addition amounts of the thermally conductive particles were as shown in Table 2. Table 2 shows the conditions and the results.

TABLE 2

|  |  | Comparative Example 1 | Comparative Example 2 | Comparative Example 3 | Comparative Example 4 | Comparative Example 5 |
|---|---|---|---|---|---|---|
| Matrix | Base polymer: A1 (g) | 50 | 50 | 50 | 50 | 50 |
|  | Base polymer: A2 (g) | 50 | 50 | 50 | 50 | 50 |
| Catalyst | Platinum catalyst (g) | 1 | 1 | 1 | 1 | 1 |
| Thermally conductive particles | Crushed alumina 0.3 μm (g) |  | 400 | 500 |  | 400 |
|  | Crushed AlN 1.2 μm (g) | 520 | 200 | 300 | 600 | 300 |
|  | Crushed AlN 28.8 μm (g) | 295 | 420 | 420 | 340 | 420 |
|  | Spherically agglomerated AlN 50 μm (g) |  |  |  |  |  |
|  | Spherically agglomerated AlN 80 μm (g) | 640 | 980 | 980 | 740 | 800 |
| Additive agent | Decyltrimethoxysilane (g) | 5 | 5 | 5 | 5 | 5 |
| Result | Thermal conductivity (W/mK) [Hot disk] | 9.5 | 10.3 | 11.0 | Not measurable | 10.4 |
|  | Hardness [ASKER C] | 70 | 33 | 74 | Not measurable | 55 |

TABLE 2-continued

|  |  | Comparative Example 1 | Comparative Example 2 | Comparative Example 3 | Comparative Example 4 | Comparative Example 5 |
|---|---|---|---|---|---|---|
| Note | Total amount of thermally conductive particles (g) | 1455 | 2000 | 2200 | 1680 | 1920 |
|  | Alumina/total amount of thermally conductive particles (% by mass) | 0 | 20.0 | 22.7 | 0 | 20.8 |
|  | AlN 50 μm or more/AlN 5 μm or less | 1.23 | 4.90 | 3.27 | 1.23 | 2.67 |
|  | Total amount of thermally conductive particles/gross amount (% by mass) | 93.2 | 95.0 | 95.4 | 94.1 | 94.8 |

As the above Examples, the thermally conductive particles satisfy the following conditions with respect to 100 parts by mass of the silicone rubber:
  (a) 900 parts by mass or more of aluminum nitride with an average particle size of 50 μm or more;
  (b) 400 parts by mass or more of aluminum nitride with an average particle size of 5 urn or less; and
  (c) more than 0 parts by mass and 400 parts by mass or less of alumina with an average particle size of 6 μm or less.

Thus, it was confirmed that a cured product of the thermally conductive composition had a thermal conductivity of 12 W/m·K or more and an Asker C hardness of 20 to 75.

In contrast to this, in Comparative Example 1, only AlN was mixed, and thus, the thermally conductive particles were not able to be highly packed. Consequently, the thermal conductivity was not high. In Comparative Example 2, the amount of small-size AlN was little. Thus, the thermal conductivity was not high. In Comparative Example 3, as the amount of small-size alumina was large, the amount of packed thermally conductive particles was large. However, the thermal conductivity was not high due to the small-size alumina itself hindering the conduction of heat. In Comparative Example 4, the thermal conductivity was not able to be measured. In Comparative Example 5, as the amount of large-size AlN was little, the thermal conductivity was not high.

INDUSTRIAL APPLICABILITY

The thermally conductive composition and the thermally conductive sheet of the present invention are suitable for being interposed between a heat generating part and a heat dissipater of an electrical component, an electronic component or the like.

DESCRIPTION OF REFERENCE NUMERALS

1 Thermal conductivity measuring apparatus
2 Sensor
3a, 3b Sample
4 Tip of the sensor
5 Electrode for applied current
6 Electrode for resistance value (temperature measurement electrode)

The invention claimed is:
1. A thermally conductive composition comprising
a thermosetting resin being a matrix resin, a curing catalyst, and thermally conductive particles,
wherein the thermally conductive particles include, with respect to 100 parts by mass of the matrix resin component,
  (a) 900 parts by mass or more of spherically agglomerated aluminum nitride with an average particle size of 50 μm or more,
  (b) 400 parts by mass or more of irregularly shaped aluminum nitride with an average particle size of 5 μm or less, and
  (c) more than 0 parts by mass and 400 parts by mass or less of irregularly shaped alumina with an average particle size of 6 μm or less,
  the alumina (c) has previously been surface treated with a silane coupling agent, and
  a cured product of the thermally conductive composition has a thermal conductivity of 12 W/m·K or more and an Asker C hardness of 20 to 75.

2. The thermally conductive composition according to claim 1, wherein the thermosetting resin is at least one thermosetting resin selected from a silicone polymer, acrylic rubber, fluorocarbon rubber, epoxy resin, phenol resin, unsaturated polyester resin, melamine resin, acrylic resin, silicone resin, and fluorocarbon resin.

3. The thermally conductive composition according to claim 1, wherein 0.1 to 10 parts by mass of the silane coupling agent is further added with respect to 100 parts by mass of the matrix resin component.

4. The thermally conductive composition according to claim 1, wherein an addition ratio of the alumina (c) to a total amount of the thermally conductive particles is more than 0 and 19% by mass or less.

5. The thermally conductive composition according to claim 1, wherein an addition ratio of the aluminum nitride (a) with the average particle size of 50 μm or more to the aluminum nitride (b) with the average particle size of 5 μm or less is (a)/(b)=1.65 to 2.60.

6. The thermally conductive composition according to claim 1, wherein the thermally conductive particles further include 350 to 500 parts by mass of aluminum nitride (d) with an average particle size of more than 5 μm and less than 50 μm with respect to 100 parts by mass of the matrix resin component.

7. A thermally conductive sheet comprising a thermally conductive composition
the thermally conductive composition comprising a thermosetting resin being a matrix resin, a curing catalyst, and thermally conductive particles,
wherein the thermally conductive particles include, with respect to 100 parts by mass of the matrix resin component,
  (a) 900 parts by mass or more of spherically agglomerated aluminum nitride with an average particle size of 50 μm or more,
  (b) 400 parts by mass or more of irregularly shaped aluminum nitride with an average particle size of 5 μm or less, and (c) more than 0 parts by mass and 400 parts by mass or less of irregularly shaped alumina with an average particle size of 6 μm or less, the alumina (c) has previously been surface treated with a silane coupling agent, and a cured sheet of the thermally conductive composition has a thermal conductivity of 12 W/m·K or more and an Asker C hardness of 20 to 75.

8. The thermally conductive sheet according to claim 7, wherein the cured sheet of the thermally conductive composition has a dielectric breakdown voltage of 11 to 16 kV/mm in accordance with JIS K6249.

9. The thermally conductive sheet according to claim 7, wherein the cured sheet of the thermally conductive composition has a volume resistivity of $10^{10}$ to $10^{14}$Ω·cm in accordance with JIS K6249.

10. The thermally conductive sheet according to claim 9, wherein a thickness of the thermally conductive sheet is 0.2 to 10 mm.

11. The thermally conductive sheet according to claim 9, wherein the matrix resin component is an addition-curable silicone polymer.

12. The thermally conductive sheet according to claim 9, wherein 0.1 to 10 parts by mass of the silane coupling agent is further added with respect to 100 parts by mass of the matrix resin component.

13. The thermally conductive sheet according to claim 9, wherein an addition ratio of the alumina (c) to a total amount of the thermally conductive particles is more than 0 and 19% by mass or less.

14. The thermally conductive sheet according to claim 9, wherein an addition ratio of the aluminum nitride (a) with the average particle size of 50 μm or more to the aluminum nitride (b) with the average particle size of 5 μm or less is (a)/(b)=1.65 to 2.60.

15. The thermally conductive sheet according to claim 9, wherein the thermally conductive particles further include 350 to 500 parts by mass of aluminum nitride (d) with an average particle size of more than 5 μm and less than 50 μm with respect to 100 parts by mass of the matrix resin component.

16. The thermally conductive composition according to claim 1, wherein the thermosetting resin is at least one selected from an addition-curable silicone polymer, a peroxide curable silicone polymer, and a condensation silicone polymer.

* * * * *